(12) United States Patent
Barnes et al.

(10) Patent No.: US 8,383,552 B1
(45) Date of Patent: Feb. 26, 2013

(54) FLUX PINNING OF CUPRATE SUPERCONDUCTORS WITH NANOPARTICLES

(75) Inventors: Paul N. Barnes, West Milton, OH (US); Timothy J. Haugan, Beavercreek, OH (US)

(73) Assignee: The United States of America as Represented by the Secretary of the Air Force, Washington, DC (US)

( * ) Notice: Subject to any disclaimer, the term of this patent is extended or adjusted under 35 U.S.C. 154(b) by 1404 days.

(21) Appl. No.: 12/023,973

(22) Filed: Jan. 31, 2008

Related U.S. Application Data

(63) Continuation-in-part of application No. 11/543,286, filed on Oct. 3, 2006, now Pat. No. 7,871,663.

(60) Provisional application No. 60/887,478, filed on Jan. 31, 2007.

(51) Int. Cl.
*H01L 39/12* (2006.01)
*H01B 12/00* (2006.01)

(52) U.S. Cl. ........ 505/234; 505/125; 505/150; 505/237; 505/238; 505/785; 428/698; 428/701; 428/930

(58) Field of Classification Search .................. 505/125, 505/150, 234, 237, 238, 320, 434, 470, 704, 505/785; 428/698, 701, 930; 427/62, 597, 427/596, 586, 126.3
See application file for complete search history.

(56) References Cited

U.S. PATENT DOCUMENTS

| | | | |
|---|---|---|---|
| 5,998,338 A | 12/1999 | Watanabe et al. | |
| 6,569,360 B2 | 5/2003 | Wu | |
| 6,569,811 B1 | 5/2003 | Shi | |
| 6,645,313 B2 | 11/2003 | Goyal et al. | |
| 6,699,820 B2 | 3/2004 | Bielefeldt et al. | |
| 6,782,282 B2 * | 8/2004 | Bielefeldt et al. | 505/230 |
| 6,830,776 B1 * | 12/2004 | Barnes et al. | 427/63 |
| 2005/0159298 A1 | 7/2005 | Rupich et al. | |

OTHER PUBLICATIONS

Barnes et al, "Inducing self-assembly of Y2BaCuO5 nanoparticles via Ca-doping for improved pinning in YBa2Cu3O7-x," Physica C 469 (2009) 2029-2032.*
Tsurumi et al., *High $T_c$, Superconductivities of $A_2Ba_4Cu_6O_{14+y}$*, Japanese Journal of Applied Physics, pp. 856-857, vol. 26, No. 5, May 1987.
Fincher et al., *Ce and Tb Substitution for Y in $YBa_2Cu_3O_9$ Thin Films*, Physical Review Letters, pp. 2902-2905, vol. 67, No. 20, Nov. 1991.
Staub et al., *Tb Oxidation State and Hybridization in $Y_{0.9}Tb_{0.1}Ba_2Cu_3O_{7-\delta}(\delta=0.02, 0.84)$: A Magnetic-Susceptibility and X-ray Absorption Study* Physical Review B, pp. 7085-7091, vol. 5o, No. 10, Sep. 1994.

(Continued)

*Primary Examiner* — Stanley Silverman
*Assistant Examiner* — Kallambella Vijayakumar
(74) *Attorney, Agent, or Firm* — AFMCLO/JAZ; Fredric Sinder

(57) ABSTRACT

The present invention provides a method of making a high temperature superconductor having a doped, nanoparticulate pinning structure. The method includes providing a nanoparticulate pinning material, providing a cuprate material, doping the nanoparticulate pinning material with a dopant to form a doped nanoparticulate material, depositing a layer of the cuprate material on a substrate, and depositing a layer of the doped nanoparticulate material on the layer of cuprate material. The invention also provides a high temperature superconductor (HTS) having a doped, nanoparticulate pinning structure including a plurality of layers of a cuprate material and a plurality of layers of a doped nanoparticulate pinning material. At least one layer of the doped nanoparticulate pinning material is stacked between two layers of the cuprate material.

9 Claims, 4 Drawing Sheets

OTHER PUBLICATIONS

Kell et al., *Tb and Ce Dopeed Y123 Films Processed by Pulsed Laser Deposition*, Applied Superconductivity Conference Presentation, abstract only, Oct. 2004.

Freibert et al., *Anisotropic Magneto-Resistivity in Pr and Tb Doped YBCO*, American Physical Society Annual Meeting, Abstract Only, Mar. 1996.

Hilgenkamp et al., *Superconducting and Normal-State Properties of $YBa_2Cu_3O_{7-\delta}$-Bicrystal Grain Boundary Junctions in Thin Films*, Applied Physics Letters, pp. 265-267, vol. 73, No. 2, Jul. 13, 1998.

Haugan et al, *Addition of Nanoparticle Dispersions to Enhance Flux Pinning of the $YBa_2Cu_3O_{7-x}$ Superconductor*, Letters to Nature, pp. 867-870, vol. 430, Aug. 19, 2004.

Haugan et al., *Island Growth of $Y_2BaCuO_5$ Nanoparticles in $(211_{-1.5\,nm}/123_{-10\,nm})xN$ Composite Multilayer Structures to Enhance Flux Pinning of $YBa_2Cu_3O_{7-\delta}$ Films*, J. Mater. Res., pp. 2618-2623, vol. 18, No. 11, Nov. 2003.

Hammerl et al., *Enhanced Supercurrent Density in Polycrystalline $YBa_2Cu_3O_{7-\delta}$ at 77K from Calcium Doping of Grain Boundaries*, Letters to Nature, pp. 162-164, vol. 407, Sep. 14, 2000.

Daniels et al., *Improved Strong Magnetic Field Performance of Low Angle Grain Boundaries of Calcium and Oxygen Overdoped $YBa_2Cu_3O_x$*, Applied Physics Letters, pp. 3251-3253, vol. 77, No. 20, Nov. 13, 2000.

* cited by examiner

FLUX PINNING OF CUPRATE SUPERCONDUCTORS WITH NANOPARTICLES

CROSS REFERENCE TO RELATED APPLICATIONS

The present application is related to, but does not claim priority from, U.S. patent application Ser. No. 11/543,286, filed Oct. 3, 2006, now U.S. Pat. No. 7,871,663, titled "Minute Doping for YBCO Flux Pinning." The present application is also related to, and does claim priority from U.S. Provisional Patent Application No. 60/887,478, filed Jan. 31, 2007, titled "A New Architecture to Incorporate Relevant Flux Pinning Materials into High Temperature Superconductors." Patent application Ser. Nos. 60/887,478 and 11/543,286 are incorporated by reference into this description.

RIGHTS OF THE GOVERNMENT

The invention described herein may be manufactured and used by or for the Government of the United States for all governmental purposes without the payment of any royalty.

FIELD OF THE INVENTION

The present invention relates generally to high temperature superconductors and more specifically to a method of imparting magnetic flux pinning within a high temperature superconductor to improve current transport by introducing dopants and/or nanoparticles into the superconducting material.

BACKGROUND OF THE INVENTION

High Temperature Superconductors (HTS) are type II superconductors that react in a known manner when exposed to applied magnetic fields. When an HTS is exposed to a magnetic field >Hc1 at approximately 20 mT, the magnetic field enters the superconductor as a self-interacting lattice of quantized line vortices or fluxons. Each fluxon is a tube of radius London penetration depth $\lambda(T)$ with superconducting current circulating around a non-superconducting core of radius on the order of the coherence length $\zeta(T)$. The magnetic field trapped in each fluxon is quantized with a value $2 \times 10^{-15}$ Wb.

To carry a stable current, the fluxon lattice in the superconductor must be prevented from moving by pinning each fluxon in an area that contains a non-superconducting material or defect. The size of pinning defects should be on the order of the coherence length, approximately 1-2 nm at 4.2K and 2-4 nm at 77K. The introduction of any type of intrinsic or extrinsic defect can act as effective pinning center. Introduction of extrinsic defects provide a straightforward method to control flux pinning, without disturbing the superconductor.

Extrinsic defects have been added by a variety of processes which typically fall into two categories: irradiation or bombarding the HTS films with energetic particles which displaces material leaving tracks, or by incorporating small inclusions of alternate material into the films. Irradiation is considered too expensive to be practical.

The desirability of providing efficient high temperature superconductors for operation at 20° K and higher is well known. Indeed, there has been an enormous amount of experimental activity in these so called high temperature superconductors since research in the mid 1980s first demonstrated dramatic gains in raising the maximum critical transition temperatures from the 20° K range to the 90° K range.

In general, superconductors and superconducting material exhibit zero resistance when operating at temperatures below their maximum critical transition temperature. This quality of operating at zero resistance facilitates the construction and operation of highly efficient devices such as superconducting magnets, magnetic levitators, propulsion motors and magnetohydronamics, power generators, particle accelerators, microwave and infrared detectors, etc.

High temperature superconducting (HTS) generators and magnets are significantly lighter and more compact than their conventional counterparts. The development of these devices is essential to military applications requiring compact, lightweight, high power sources or compact high field magnets, especially ground mobile, airborne and naval applications. The high temperature superconducting coated conductor can be used to make the coil windings in HTS generators as well as the HTS magnet windings. As such, long lengths of the YBCO coated conductor with high current transport in a magnetic field are necessary for effective use in these applications.

Given the important role high temperature superconductors will play in future technology, several attempts have been made to improve high temperature superconductors. For example, Calcium (Ca) doping at Y site in Y123 films has been studied extensively, as Ca is expected to increase the population of holes in Y123 by replacing $Y^{+3}$ with $Ca^{+2}$ hence improving superconductor coupling between the grains (intergranularly). Scientists have reported a 2 to 6 fold improvement of critical current density ($J_c$) between large-angle grains (intergranular $J_c$) for annealed Y123/Ca-Y123/Y123 multi-layer films at 77 K and lower temperatures, however only for very large angle grain boundaries 24° [001] ab in-plane misorientation. Other scientists have reported that. Ca doping increased the intergranular critical current density in spite of a lower critical transition temperature ($T_c$) in higher concentrations of Ca doped Y123 films; however such increases were only measured well below $T_c$ at about 60K or less.

In U.S. Pat. No. 6,830,776 (along with other references), Barnes et al. demonstrated that Y123/Y211 nanoparticulates/Y123 multi-layers exhibit highest magnetization $J_c$ due to uniform distribution of nano-ordered pinning centers.

There is a further need for low-cost methods for incorporating inclusions or defects into HTS. The present invention addresses this need by providing 1) minute quantities of rare earth elements or other deleterious elements in YBCO thin films and 2) providing a combination effect of Ca doping as well as 211 pinning in Y123 materials to increase the critical current carrying capability across grain boundaries as well as in high magnetic fields.

SUMMARY OF THE INVENTION

In one embodiment, the present invention incorporates the substitution or addition of minute quantities of rare earth elements (La, Ce, Pr, Nd, Pm, Sm, Eu, Gd, Tb, Dy, Ho, Er, Tm, Yb, Lu) or other deleterious elements (Sc, etc.) in YBCO thin films to achieve the appropriate defect densities for enhanced flux pinning. Advantageously, the method of the present invention enables enhanced flux pinning of the material while not significantly increasing the cost of the HTS material or processing parameters. The minute doping approach of the present invention can be used in all HTS deposition methods such as MOCVD, MOD, PLD, sol-gel, sputtering electrolytic deposition, etc., since it is not process dependent.

In another embodiment, the invention provides a new architecture to incorporate relevant flux pinning materials into high temperature superconductors for achieving high critical currents in magnetic fields. This embodiment combines: 1) the advantages of Ca doping to improve intergranular supercurrents and 2) the advantages of further doping nanoparticulate inclusions with Ca for magnetic flux pinning to improve the intragranular supercurrents.

More specifically, this embodiment of the invention addresses the improvement of the supercurrent carrying capabilities of epitaxial or bi-crystalline or polycrystalline high temperature superconductors, especially $RBa_2Cu_3O_{7-x}$ (RBCO) where R=(Y, rare earths) superconducting coated conductors. This is accomplished by providing a nanoparticulate pinning structure with appropriate predetermined nanoscale insulating pinning materials throughout the superconducting film and by doping appropriate amount of Ca into the insulating pinning material. Using Ca-doping, the space charge layers at the grain boundaries can be reduced and thereby the current transport properties of the superconducting film can be significantly improved.

Also, due to the pinning nature of the insulating material, the influence of magnetic fields on the critical densities is significantly reduced, which further enhances the overall supercurrent carrying capabilities. These things are accomplished while keeping the critical temperature and transport properties of the films at reasonably elevated values when compared with pure RBCO films. An exemplary method of the invention combines into a single step the advantages of Ca-doping to improve intergranular supercurrents with the advantages of nanoparticulate inclusions for magnetic flux pinning to improve the intragranular supercurrents. By this method, these simultaneous advantages can be achieved, however without decreasing the critical transition temperature of the Y123 superconducting layer which typically occurs with Ca addition.

For demonstration, $Y_{2-x}Ca_xBaCuO_5$ (where x is approximately 0 to 10% of Y molar fraction) is the pinning material. However, the process can also use Ca-doping of any material to be used for the particulate inclusions in the superconductor. The nanoparticulate dispersion in the HTS material was demonstrated using pulsed laser deposition; however, the process could be applied to other HTS materials and using other thin film deposition or coating techniques such as Molecular Beam Epitaxy, sputtering, metal oxide deposition, e-beam evaporation, sol-gel, Metal oxide chemical vapor deposition etc. to insert the nanoparticulates.

In accordance with one aspect of the invention, there is provided a method of making a high temperature superconductor having a doped, nanoparticulate pinning structure. The method includes providing a nanoparticulate pinning material, providing a cuprate material, doping the nanoparticulate pinning material with a dopant to a form doped nanoparticulate material, depositing a layer of the cuprate material on a substrate, and depositing a layer of the doped nanoparticulate material on the layer of cuprate material.

The nanoparticulate pinning material may be an oxide. For example, the pinning material may be $Y_{2-x}BaCuO_5$ (Y211) or $R_{2-x}BaCuO_5$ (R211), where R is a rare earth element. The cuprate material is a superconductor material. For example, the cuprate material may be $YBa_2Cu_3O_{7-x}$ (Y123) or $RBa_2Cu_3O_{7-x}$ (R123), wherein R is a rare earth element.

The steps of depositing may include depositing alternating stacked layers of the cuprate material and the doped nanoparticulate material on the substrate. The alternating stacked layers may total about 40 to 70 layers. At least one of the depositing steps may be performed by pulsed laser deposition, Metal-Organic Chemical Vapor Deposition (MOCVD), Metal-Organic Deposition (MOD), sol-gel, sputtering electrolytic deposition, and other suitable techniques.

In accordance with another aspect of the invention, there is provided a high temperature superconductor (HTS) having a doped, nanoparticulate pinning structure. The HTS includes a plurality of layers of a cuprate material and a plurality of layers of a doped nanoparticulate pinning material. At least one layer of the doped nanoparticulate pinning material is, stacked between two layers of the cuprate material.

The cuprate material may be $YBa_2Cu_3O_{7-x}$ (Y123) or $RBa_2Cu_3O_{7-x}$ (R123), wherein R is a rare earth element. The doped nanoparticulate pinning material may be a doped oxide, such as $Y_{2-x}D_xBaCuO_5$ (doped Y211) where D is a dopant or such as $R_{2-x}D_xBaCuO_5$ (doped R211), where R is a rare earth element and D is a dopant. The dopant may be a hole donor element. For example, the dopant may be Calcium, Cobalt, or Magnesium.

BRIEF DESCRIPTION OF THE DRAWING

The accompanying drawing incorporated in and forming a part of the specification, illustrates several aspects of the present invention and together with the description serves to explain the principles of the invention. In the drawing.

DETAILED DESCRIPTION OF THE INVENTION

Figure 1:
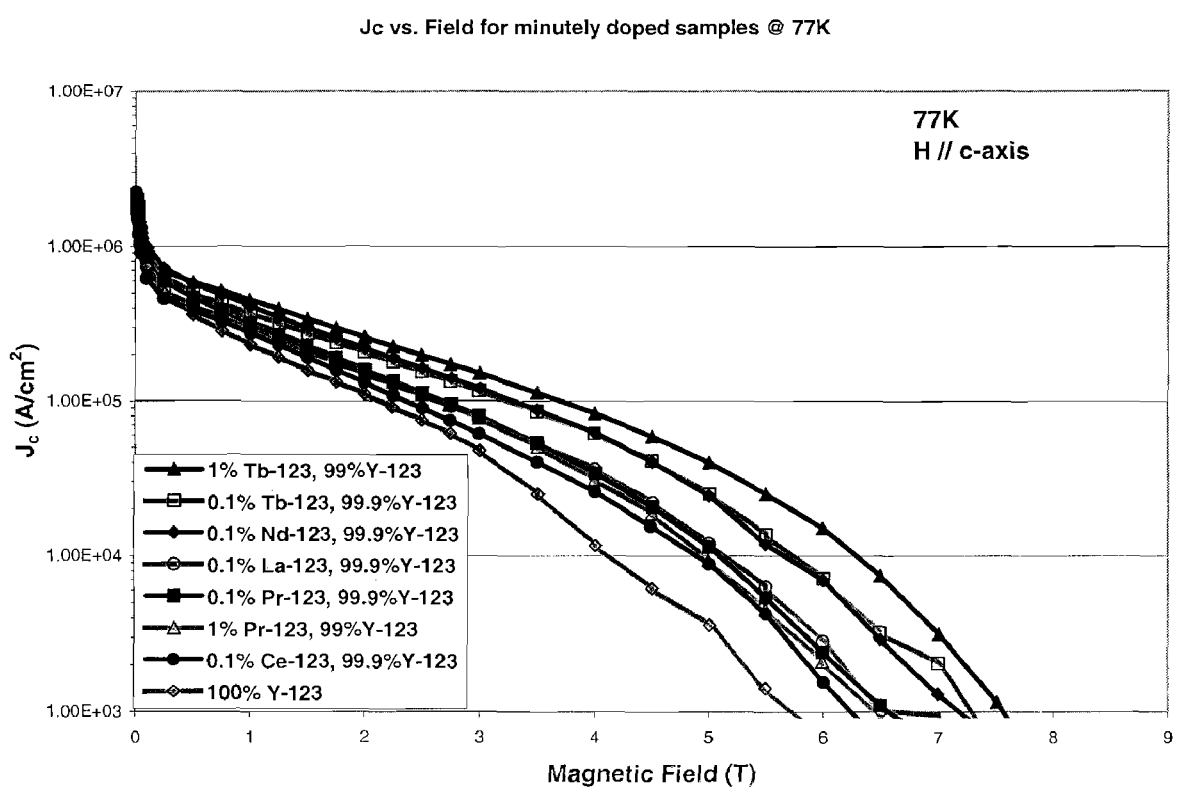
FIG. 1 is a graph illustrating the magnetic $J_c$ values of $Y_{1-x}M_xBa_2Cu_3O_{7-x}$ films, where M stands for deleterious elements (i.e. rare earth elements, Sc, etc.) compared to a reference Y123 film made using the same deposition conditions at 77K and H//c-axis.

The following section describes the substitution or addition of minute quantities of rare earth elements or other deleterious elements in YBCO thin films to achieve the appropriate defect densities for enhanced flux pinning. Additionally, this section describes improvements to high temperature superconductors concerning the incorporation of nanoparticles into superconductor material for magnetic flux pinning with nanoparticulate material that is doped.

Firstly, the present invention relates, in part, to a method of imparting magnetic flux pinning within a high temperature superconductor to improve current transport by introducing minute quantities of dopants into the material. According to the method of the present invention, substitution of small quantities ($x \leq 0.02$) of rare earth elements (La, Ce, Pr, Nd, Pm, Sm, Eu, Gd, Tb, Dy, Ho, Er, Tm, Yb, Lu) or other deleterious elements (Sc, etc.) for Y in Y123 thin films has been demonstrated to achieve the appropriate defect densities for enhanced flux pinning. As used herein, "deleterious element" is intended to refer to a material that in large quantities would degrade the performance of the superconductor in an undesirable fashion. The method of the present invention enables enhanced flux pinning of the material while not significantly increasing the manufacturing cost of the HTS material. Additionally, the minute doping approach of the present invention can be used in all HTS deposition methods such as Metal-Organic Chemical Vapor Deposition (MOCVD), Metal-Organic Deposition (MOD), Pulsed Laser Deposition (PLD), sol-gel, sputtering electrolytic deposition, etc., since it is not process dependent.

Coated conductor technology for biaxially aligned $YBa_2Cu_3O_{7-z}$ (Y123) on buffered metallic substrates with $J_c > 1$ MA/cm² offers great promise as a second generation, high temperature superconducting wire for use in generators and motors. Y123 has many useful properties at 77 K such as high critical current densities ($J_c$) and good flux pinning in applied magnetic fields, which is critical in most applications. However, when magnetic fields are applied parallel to the c-axis, $J_c$ will typically decrease by a factor of 10 to 100 within the range of $1 T < B_{appl} < 5 T$. Accordingly, further improvement of $J_c$ is desirable, especially for c-axis orientation of the applied field, to allow further reduction in system weight and size. In most applications, the value $J_c(H)$ places an upper limit on the magnetic field that can be produced/applied for a given coil design.

Recently, $REBa_2Cu_3O_{7-z}$ (RE123) (where RE stands for rare earth elements) superconductors have been considered for use in applications of thin film coated conductors because of their desirable high critical transition temperatures ($T_c$) ($\sim 92$ K), and high critical current density ($J_c$) at 77 K in applied magnetic fields. According to the method of the present invention, the partial substitution of rare earth elements or other deleterious elements (herein represented as M) in the $(Y_{1-x}M_x)Ba_2Cu_3O_{7-z}$, ($x \leq 0.02$), as dopants, has been demonstrated to enhance flux pinning. As an example, Tb, Ce and Pr are divalent, having both +3 and +4 valance states and can act as pinning sites by localized lattice distortion or other potential mechanism. Even if a rare earth can readily form the proper REBCO superconducting phase, as in the case of Nd and La, they can be poor dopants in YBCO by substituting undesirably into the Ba site, degrading the superconductor's performance. However, in small quantities, these Ba substitutions can also act as a potential pinning mechanism. In addition, using small quantities of dopants allows the same processing conditions to be used for making high quality YBCO.

An example of the method of the present invention using terbium as a dopant follows. Terbium does not degrade the $T_c$ of Y123 and the divalent nature of terbium (+3 and +4 valence states) can allow for $Tb^{4+}$ to act as pinning sites by alternate chemical bonding, localized lattice distortion, or other methods. The crystal ionic radii of $Tb^{(+3)}$ is 1.04 Å which is quite close to the ionic radii of $Y^{(+3)}$ of 1.02 Å. Because Tb123 is normally processed as a non-superconducting phase, the substitution of Tb123 for Y123 into a bulk or thin film superconductor has the potential to create localized regions of size on the order of one unit cell or larger of either reduced $T_c$ regions or potential site defects. Such regions can provide the non-superconducting pinning centers with particle densities approaching $1.5-3 \times 10^{11}$ cm⁻² which are necessary to pin magnetic fields of $\sim 3$-6 T.

According to the method of the present invention, precursor materials (i.e. laser ablation targets in the case of pulsed laser deposition) were manufactured in-house by the following procedure: $Y_{0.9}Tb_{0.1}Ba_2Cu_3O_{7-z}$ powder was prepared from $Y_2O_3$, $BaCO_3$, CuO, and $Tb_4O_7$ powder (all nominally 99.99+% pure). The powders were dried, mixed, and then calcined at 850° C. and 880° C. This powder was then used to make two targets of compositions $Y_{0.9}Tb_{0.1}Ba_2Cu_3O_{7-z}$ and $Y_{0.99}Tb_{0.01}Ba_2Cu_3O_{7-z}$ with the second composition consisting of 10 mol % $Y_{0.9}Tb_{0.1}Ba_2Cu_3O_{7-z}$ and 90 mol % Y123 powder. The targets were then fully reacted at 940° C. and 920° C. respectively for 50 hours. The $Y_{0.9}Tb_{0.1}Ba_2Cu_3O_{7-z}$ target was found to be 84.8% dense and the $Y_{0.99}Tb_{0.01}Ba_2Cu_3O_{7-z}$ target was found to be 88.7% dense. The estimated purity of the targets was 99.99+% pure.

Next, multiple compositions of (Y,Tb)123 films were deposited by pulsed laser deposition, using parameters and conditions optimized previously for Y123. The depositions were performed on strontium titanate (STO) and lanthanum aluminate (LAO) substrates with the overall time for film growth being about 20 minutes. Depositions were performed using a Lambda Physik, LFX 300 KrF excimer laser ($\lambda = 248$ nm). The laser pulse rate was 4 Hz and the laser fluence was $\sim 3.2$ J/cm². The target-to-substrate distance was kept at 6 cm for all of the depositions. The oxygen pressure during the deposition was 300 mTorr for both of the Y,Tb-123 targets, as measured with capacitance manometer and convectron gauges within <10% variation. Oxygen gas (>99.997% purity) flowed into the chamber during growth and the oxygen pressure in the chamber was kept constant using a downstream throttle-valve control on the pumping line. The laser beam was scanned across the targets to improve thickness uniformity of the film. The $LaAlO_3$ (100) and $SrTiO_3$ (100) single crystal substrates were ultrasonically cleaned for 2 minutes, using first acetone followed by isopropyl alcohol. Crystalline substrates were provided by the manufacturer epitaxially polished on both sides of the $LaAlO_3$ and on one side for $SrTiO_3$, and were attached to the heater using a thin layer of colloidal Ag paint. LAO and STO substrate sizes were $\sim 3.2 \times 3.2$ mm² for magnetic Jc measurements.

The background pressure in the chamber was reduced to $<1.4 \times 10^{-4}$ torr prior to deposition. Samples were heated from room temperature to the deposition temperature of 775° C. at $\sim 1270°$ C./h. After deposition, the vacuum pumps and $O_2$ pressure control were shut off and the films were cooled radiantly from 775° C. to 500° C. while increasing the $O_2$ pressure to 1 atm. The temperature was then held at 500° C. for 30 minutes. The films were then cooled to room temperature. The (Y,Tb)123 layer thickness was estimated by comparing previous deposition runs in the chamber using the same deposition parameters.

Magnetic $J_c$ measurements were made with a Quantum Design Model 6000 Physical Property Measurement System (PPMS) with a vibrating sample magnetometer (VSM) attachment in fields of 0 to 9 T, and a ramp rate 0.01 T/s. The $J_c$ of the square samples was estimated using a simplified Bean model with $J_c = 30 \Delta M/da^3$ where $\Delta M$ is in emu, film thickness d and lateral dimension a are in cm and J is in A/cm². Samples were subsequently acid-etched at the corners of the samples for thickness measurements. A P-15 Tencor profilometer was used to measure the thickness of the (Y,Tb) 123 films. Care was used to measure in twin-free areas of the $LaAlO_3$ substrates, which were observed visually at high magnification. The film thickness and dimensions of each sample were measured multiple times to reduce errors in determination of the superconducting volume and a to <5%.

Figure 2:
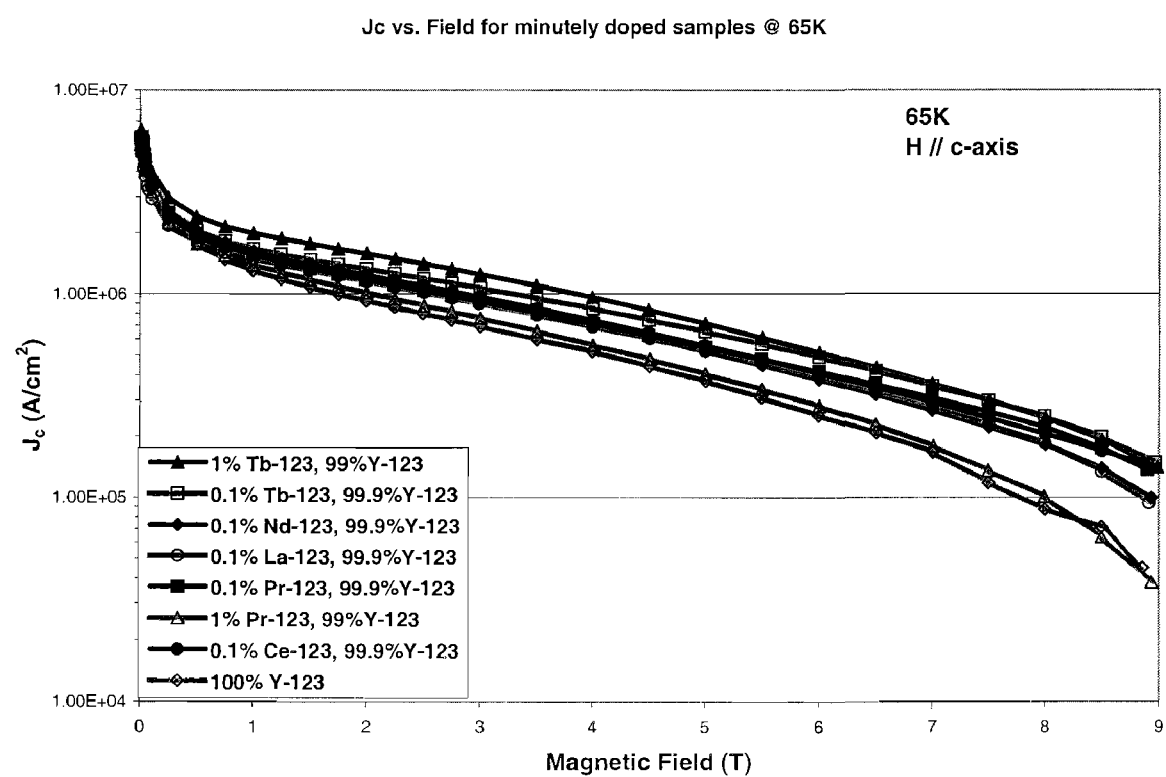
FIG. 2 is a graph illustrating the magnetic $J_c$ values of $Y_{1-x}M_xBa_2Cu_3O_{7-z}$ films compared to a reference Y123 film made using the same deposition conditions at 65K and H//c-axis.

The results of $J_c$ measurements that were performed on several samples made using this invention are shown in FIGS. 1 and 2. FIG. 1 shows the magnetic $J_c$ values of the $Y_{1-x}M_xBa_2Cu_3O_{7-z}$ films at 77 K compared to a reference 123 film made using the same deposition conditions. At elevated field, the $J_c$ values of the samples made using this invention exceeded the standard Y123 values by more than 2000% (6T, 77K, H//c-axis, M=Tb, x=0.01). FIG. 2 shows the magnetic $J_c$ values of the $Y_{1-x}M_xBa_2Cu_3O_{7-z}$ films at 65 K compared to a reference 123 film made using the same deposition conditions. At elevated field, the $J_c$ values of the samples made using this invention exceeded the standard Y123 values by more than 200% (8.9 T, 77K, H//c-axis, M=Tb, x=0.01).

Thus, the minute doping method of the present invention has been demonstrated to provide enhanced flux pinning within HTS materials. Additionally, while the invention has been described in terms of pulsed laser deposition techniques, it is not considered so limited. The minute doping approach of the present invention can be used in all HTS deposition methods such as MOCVD, MOD, PLD, sol-gel, sputtering electrolytic deposition, etc., since it is not process dependent.

The remaining portion of this section describes further improvements to high temperature superconductors. That is, doped nanoparticles are incorporated into superconductor material for magnetic flux pinning and grain boundary enhancements. For example, an oxide is doped with a dopant and is combined with a cuprate superconductor material to improve intergranular and intragranular supercurrents without significantly degrading the critical temperature $T_c$ and critical currents. The doped oxide is deposited on or in the cuprate material as nanoparticles. The concentration of dopant additions into the nanoparticles may be in the range of 1%-15% by molar fraction substitution. In an exemplary embodiment, the concentration is 10% by molar fraction substitution. The concentration of nanoparticle additions into YBCO are in the range of 1%-20% by volume fraction, or alternatively the spacing of nanoparticles may be in the range of 3-30 nm. The oxide may be any oxide known by one skilled in the art to be used with cuprate superconductor material. Examples of oxides are $Y_{2-x}BaCuO_5$ (Y211) and $R_{2-x}BaCuO_5$ (R211). Examples of cuprate material that may be used in this invention include $YBa_2Cu_3O_{7-x}$ (Y123) or $RBa_2Cu_3O_{7-x}$ (R123) where R is a rare earth material as previously described. The dopant may be any hole donor element, for example, Calcium, Cobalt, or Magnesium.

The inventive process entailed ablating $YBa_2Cu_3O_{7-x}$ (Y123) and $Y_{2-x}Ca_xBaCuO_5$ (Ca-doped Y211) targets using the output of a KrF (248 nm) excimer laser and doing this with conditions ranging from 200-500 mTorr of $O_2$ pressure and 750°-850° C. substrate temperature. Ca-doped Y211 ($Y_{2-x}Ca_xBaCuO_5$) layers were deposited with a thickness in the range of approximately 0.4-0.7 nm, for example 0.6 nm thick. These layers were alternated with layers of $YBa_2Cu_3O_{7-x}$ with a thickness in the range of 5-10 nm, for example 9 nm thick. Approximately 40-70 layers of 211 alternated with 123 were deposited, for total film thickness of about 0.3 micron. Following deposition, the film was cooled and annealed at 500° C. in 1 atm of $O_2$. Films were also deposited onto $SrTiO_3$ bicrystals with grain boundaries misorientations of 6°, 12°, 24° and 36°, to measure the effect of Ca-doped 211 additions on grain boundary transports.

The pinning properties were measured in magnetic fields up to 9 T using a Vibrating Sample Magnetometer (VSM). The electrical transport measurements were done at 77K in self-field. Microstructure was investigated using Cross sectional Transmission Electron Microscopy. The primary architecture consisted of alternating layers of R123 with nano-layered Ca doped R211 materials. Nano layered materials can be either Ca-doped R211 or other Ca-doped oxides that provide effective pinning, e.g. $Ba_xCa_{1-x}ZrO_3$. A bi-axially textured substrate with buffer layers (either processed using RABITS method or IBAD method) of any chemically compatible materials with RBCO comp can be coated with the above multi-layer architecture in order to achieve better electrical transport properties in self field or high magnetic field.

During testing of the invention, the deposition was performed using PLD conditions optimized to provide maximum critical transition temperature ($T_c$) and critical current density ($J_c$) in the YBCO-123 film layer. The non-superconducting material was chosen to be $Y_{2-x}Ca_xBaCuO_5$ (Ca-doped 211) with x=0.05 to 0.1. Nanoparticles of almost the same size and areal number density were achieved with Ca-doped 211 compared to Y211, as observed by cross-sectional TEM. The flux pinning properties were measured. The $J_c$ for a multilayer YBCO sample with Ca-doped 211 interlayers deposited onto single crystal substrates was observed to increase by 2-3 times for applied magnetic fields up to 2 Tesla at 65K-77 K compared to similar thickness YBCO-only films without 211 interlayers, and a small but measurable increase compared to YBCO films with 211 (instead of Ca-doped 211) interlayers. This is a single step process (i.e. doping 211 with Ca and applying the Ca-doped 211 as nanoparticles). This single step process significantly improves HTS and results in considerable cost savings when applied to long length conductors. Importantly, this method of Ca-addition did not reduce the superconducting transition temperature in multiple tests, which is typically observed with other methods of Ca-doping directly onto the Y123 layer. As a result, a positive increase of $J_c$ across STO bicrystal grain boundaries particularly at 77K is a possibility with this sort of Ca-doping method, which does not degrade the flux pinning properties.

Figure 3:
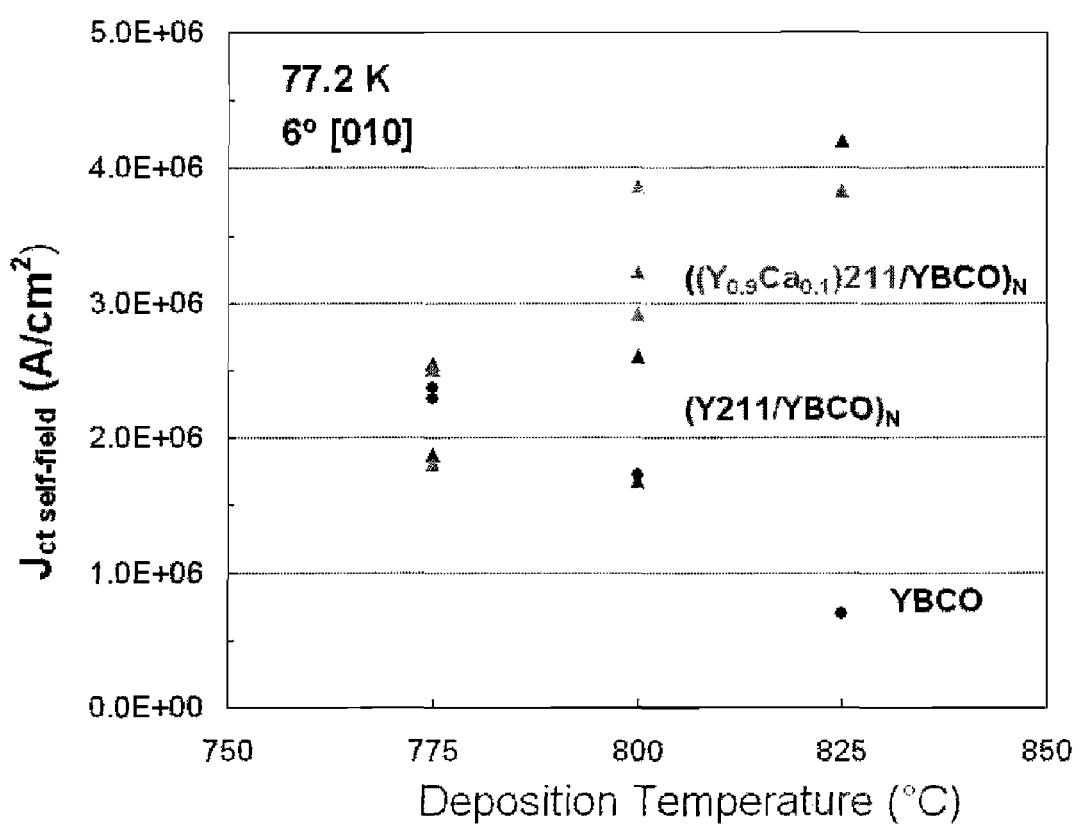
FIG. 3 is a graph illustrating $J_{ct}$ across [010] c-axis tilt grain boundaries with misorientation angle of 6° versus deposition temperature for Ca-doped 211 with Y123 and Y211 with YBCO compared to YBCO. For $(M/YBCO)_N$ multilayer films the M=Ca-doped 211 or Y211 layer thickness was 0.4-0.7 nm thickness, the YBCO layer thickness was 5-11 nm, and the number of N bilayers was from 20-28, and the bicrystal substrate was single-crystal $SrTiO_3$.
Figure 4:
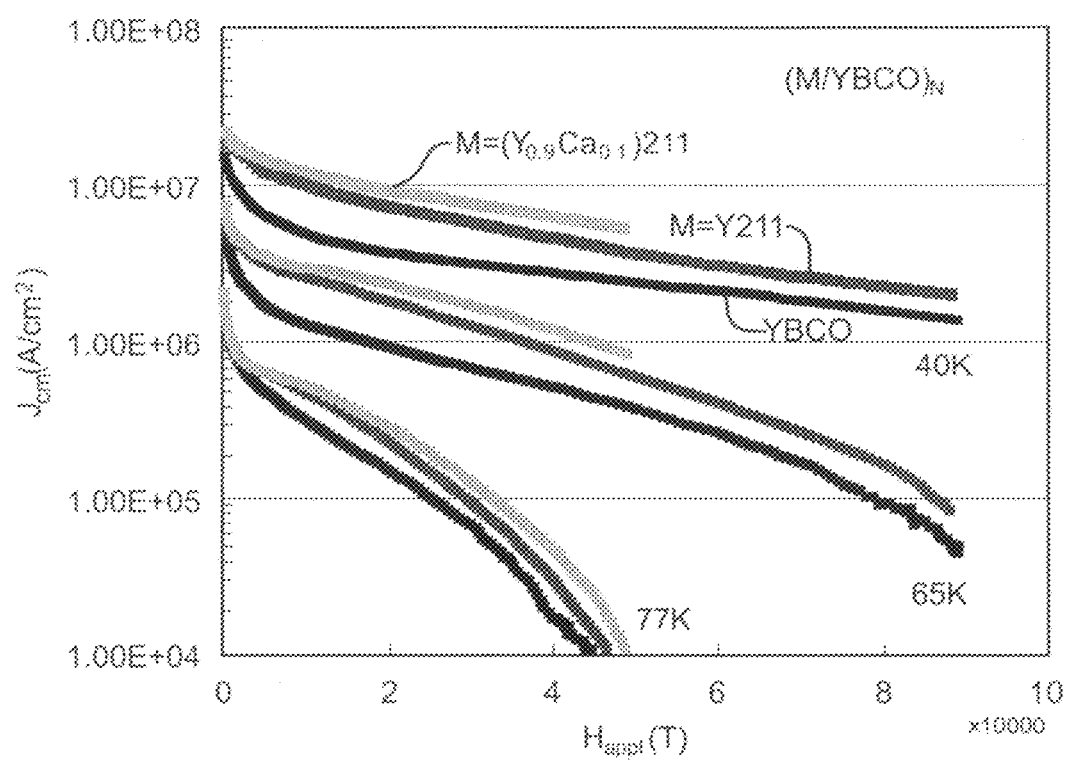
FIG. 4 is a graph illustrating magnetic $J_c$ values ($J_{cm}$) versus $H_{appl}$ measured on $LaAlO_3$ or $SrTiO_3$ single crystal substrates for Ca-doped 211, Y211, and YBCO at 40K, 65K and 77K; For $(M/YBCO)_N$ multilayer films the M=Ca-doped 211 or Y211 layer thickness was 0.4-0.5 nm thickness, the YBCO layer thickness was 8-10 nm, and the number of N bilayers was 28.

In the drawings, FIG. 3 shows that Ca-doped 211 with YBCO has the greatest $J_{ct}$ across [010] c-axis tilted grain boundaries of 6° when compared to Y211 with YBCO and compared to YBCO. Similar increases of $J_c$ of 2× were achieved for GB angles from 6°-12°, and large increases of $J_c$ of 8×-30× were achieved for very large angle GB's of 24°-36°. This demonstrates that Ca-doped 211 provides strong increase of $J_c$ across grain boundaries of different orientation angles and structures. FIG. 4 shows that Ca-doped 211 with YBCO has the greatest $J_{cm}$ in magnetic fields up to 9 Tesla at 40K, 65K and 77K measured on single-crystal substrates with average grain boundary angles <1°. This demonstrates that Ca-doped 211 also does not degrade the magnetic field dependence (flux pinning) of the grains themselves, but further improves it. FIGS. 3 and 4 indicate that Ca-doped 211 increases $J_c$ both inside the grains (intragranular) with flux pinning enhancements and across high-angle grain boundaries (intergranular) simultaneously. The physical mechanisms to improve $J_c$ across grain boundaries and in magnetic fields are not necessarily related, so this achievement is notable and important to enable both of these processes to be improved simultaneously in YBCO wire manufacturing.

The preceding embodiment of HTS having Ca-doped 211 with Y123 was created using pulsed laser deposition techniques. However, the doping and nanoparticle approach of the invention can be used in all HTS deposition methods such as MOCVD, MOD, PLD, sol-gel, sputtering electrolytic deposition, and other techniques known to one with ordinary skill in the art.

It is further contemplated that preceding processes and resulting superconductors may be modified to form yet another embodiment of the present invention. That is, Y211 nanoparticles may be deposited onto or within YBCO. The manufacturing methods previously described may be applied by one with skill in the art to form Y211 nanoparticles with YBCO. As seen in FIGS. 3 and 4, Y211/YBCO was tested and exhibits strong superconducting properties, both intragranularly and intergranularly. This demonstrates for the first time ever that an ionic dopant other than Ca can strongly enhance YBCO grain boundary properties at 77K. This new invention indirectly suggests physical mechanisms rather than electronic dopants can be suitable to provide grain boundary healing. For example, healing occurs by choosing or finding the right dopant atom with proper ionic size to fill the grain boundary porosities and dislocations. High temperature deposition at 825° C. was also observed to be critically important to enable this effect, as shown in FIG. 3. At this higher temperature of 825° C., YBCO has been observed with transmission electron microscopy (TEM) to form more perfect lattice structures, which suggests the higher temperature provides a softening effect allowing the film structures to grow more evenly and even out stresses. These stresses and film relaxations may be critical mechanisms to healing and covering the grain boundary, and allows the dopant additions to have the strong effects. Previously, dopants including Pt, Ag, Co, Ni, Pt, and Fe were tested by scientists without improvement, but rather with further degradation of grain boundary $J_c$s.

The foregoing description of the illustrated embodiment has been presented for purposes of illustration and description. It is not intended to be exhaustive or to limit the invention to the precise form disclosed. Obvious modifications or variations are possible in light of the above teachings. The embodiment described was chosen to provide an illustration of the principles of the invention and its practical application to thereby enable one of ordinary skill in the art to utilize the invention in various embodiments and with various modifications as are suited to the particular scope of the invention as determined by the appended claims when interpreted in accordance with the breadth to which they are fairly, legally and equitably entitled.

What is claimed is:

1. A high temperature superconductor (HTS) having a doped, nanoparticulate pinning structure, comprising:
    a plurality of layers of a cuprate material; and,
    a plurality of layers of a doped nanoparticulate pinning material, at least one layer of the doped nanoparticulate pinning material being stacked between two layers of the cuprate material.

2. The HTS of claim 1, wherein the cuprate material is $YBa_2Cu_3O_{7-x}$ (Y123).

3. The HTS of claim 1, wherein the cuprate material is $RBa_2Cu_3O_{7-x}$ (R123), where R is a rare earth element.

4. The HTS of claim 1, wherein the doped nanoparticulate pinning material is a doped oxide.

5. The HTS of claim 4, wherein the doped oxide is $Y_{2-x}D_x BaCuO_5$ (doped Y211), where D a dopant.

6. The HTS of claim 5, wherein the dopant is a hole donor element.

7. The HTS of claim 6, wherein the hole donor element is selected from the group consisting of calcium, cobalt and magnesium.

8. The HTS of claim 4, wherein the doped oxide is $R_{2-x}D_x BaCuO_5$ (doped R211), where R is a rate earth element and D is a dopant.

9. The HTS of claim 8, wherein the dopant is selected from the group consisting of calcium, cobalt and magnesium.

* * * * *